United States Patent [19]

Pai et al.

[11] Patent Number: 4,759,993
[45] Date of Patent: Jul. 26, 1988

[54] PLASMA CHEMICAL VAPOR DEPOSITION $SIO_{2-x}$ COATED ARTICLES AND PLASMA ASSISTED CHEMICAL VAPOR DEPOSITION METHOD OF APPLYING THE COATING

[75] Inventors: Purnachandra Pai, Birmingham; Benjamin Chao, Troy; Keith Hart, Flat Rock; Yasuo Takagi, Troy, all of Mich.

[73] Assignee: Ovonic Synthetic Materials Co., Inc., Troy, Mich.

[21] Appl. No.: 727,314

[22] Filed: Apr. 25, 1985

[51] Int. Cl.$^4$ .............................................. B05D 3/06
[52] U.S. Cl. ..................................... 428/450; 427/39; 427/93
[58] Field of Search .................. 427/38, 39, 93, 255.3; 428/450

[56] References Cited

U.S. PATENT DOCUMENTS

| | | | |
|---|---|---|---|
| 4,361,595 | 11/1982 | Kaganowicz et al. | 427/39 |
| 4,410,558 | 10/1983 | Izu et al. | 427/39 |
| 4,430,361 | 2/1984 | Robinson et al. | 427/39 |
| 4,495,218 | 1/1985 | Azuma et al. | 427/93 |

Primary Examiner—John H. Newsome
Attorney, Agent, or Firm—Richard M. Goldman; Marvin S. Siskind

[57] ABSTRACT

A coated stainless steel article and a method of preparing the article are disclosed. The coating is a plasma chemical vapor deposited coating, formed from a plasma of nitrous oxide, a silane, and an energy transfer agent (such as He, Ar). The resulting coating is adherent, corrosion resistant, and has a thickness sufficient to mask and cover the features of the stainless steel substrate, and to provide a pitting potential (in 3.5% NaCl) of greater than 600 millivolts, a J.I.S. 8502 (1982) versus a saturated calomel electrode a salt spray test rating in 5% NaCl-0.02% hydrogen peroxide of at least B.

25 Claims, 2 Drawing Sheets

PLASMA CHEMICAL VAPOR DEPOSITION SIO$_{2-x}$ COATED ARTICLES AND PLASMA ASSISTED CHEMICAL VAPOR DEPOSITION METHOD OF APPLYING THE COATING

BACKGROUND OF THE INVENTION

Metallic corrosion is an aesthetically displeasing and uneconomical loss of material that occurs when metals are exposed to hostile environments. The products of corrosion are oxidized products, where, by oxidized products are meant products containing the metal in a non-zero valence state.

The "return" of metals from a useful metallic state to an oxidized state imposes a massive cost on industrial economies. The annual economic burden of corrosion has been estimated to be on the order of 1 percent of the gross national products of the industrialized countries.

From thermodynamic considerations, the corrosion reaction (1), $$M + M'^+ = M^+ + M' \tag{1}$$

where M is the metal, and M'+ is another cation, can occur spontaneously if the equilbrium electrode potential for reaction (2), $$M'^+ + le^- = M' \tag{2}$$

is greater than the equilibrium electrode potential for reaction (3), $$M^+ + le^- = M. \tag{3}$$

This is because the oxidation reaction may be driven by coupling it to the reduction of the cation. Thus, the oxidation of iron, reaction (4), $$\tfrac{1}{2}Fe = \tfrac{1}{2}Fe^{++} + le^- \tag{4}$$

which has an equilibrium electrode potential for the reaction 4(a), $$\tfrac{1}{2}Fe^{++} + le^- = \tfrac{1}{2}Fe \tag{4a}$$

of $-0.44402$V, can be driven by coupling it to a reaction having a higher equilibrium electrode potential. In the case of the oxidation of iron, reaction (4), the driving reactions include:

$$H^+ + e^- = \tfrac{1}{2}H_2 \tag{5}$$

$$H^+ + 1/4O_2 + e^- = \tfrac{1}{2}H_2O, \text{ and} \tag{6}$$

$$\tfrac{1}{2}H_2O + 1/4O_2 + e^- = OH^- \tag{7}$$

reactions (5) and (6) are in acidic media, and reaction (7) is an alkaline media.

Various factors increase the rate of corrosion. These include the nature of the oxidizing reactants present, that is, the reactivity, concentration and temperature of the oxidizing environment., and the nature of the material, i.e. working history, thermal history, granularity, grain size, and grain orientation, among others. Additionally, kinetic factors such as bulk diffusion and electron transfer reactions determine the rate and progress of corrosion.

Corrosion may be in the form of uniform attack, characterized by progressive and uniform thinning of the metal and either the growth of an oxide or the loss of material. Alternatively, the corrosion may be a nonuniform corrosion, exemplified by galvanic corrosion arising from the juxtaposition of two or more metals of dissimilar oxidation potentials. Galvanic attack is evidenced by dissolution of the more active metal.

Another form of a nonuniform corrosion is crevice corrosion which results in corrosion at flanges, the meeting of cross members, breaks in surface coatings, at a meniscus, and at water lines.

Various effects are observed in nonuniform corrosion. One effect is selective grain boundary attack which can cause whole crystallographic grains of the metal to fall out resulting in layer corrosion. Another effect of nonuniform corrosion is the preferential dissolution of one component in an alloy. Still another effect of non-uniform corrosion is the selective dissolution of a crystallographic grain along one crystallographic orientation. Other effects of nonuniform corrosion result from variations in reactivity brought about by surface films, surface oxides, nitriding and the like, such as pitting attack.

Additionally, mechanical stress may increase corrosion. For example mechanical stress results in stress corrosion cracking, which is a form of crevice attack at cracks that develop and constitute a self-perpetuating region of localized attack. Erosion corrosion, also known as impingement corrosion, occurs as the result of impingement of entrained particles in a stream of corrosive material. Mechanical effects of corrosion are evidenced by hydrogen embrittlement and corrosion fatigue.

Various means have been attempted to limit corrosion. These include sacrificial anodes, impressed current cathodic protection, galvanization, formation of stable oxides, and protective coatings. Coating the surface, as with a paint, polymer, or metalloid, provides an impermeable layer which eliminates contact between the corrosive medium and the metal. However, in order to be effective, coatings must be adherent and pin-hole free. Tnis is because defects allow a corrosive medium, e.g., water, chloride ion, sulfate ion, sulfur compounds, or oxygen, access to the metal. The corrosive medium can then supply electrons at the edges of the pin-hole. The resulting corrosion takes place under the coating, where the extent of damage is difficult to assess. Moreover, lack of adhesion can cause the coating to delaminate or develop holes or voids. One class of protective coatings found to be particularly desirable are coatings of disordered materials, for example coatings of iron and steels with various oxide forming metals, and coatings of iron and steels with various nonmetals deposited or formed under conditions that result in a disordered material. Corrosion can also be reduced by suitable alloying agents, as is the case with stainless steels.

Stainless steels are desired for their normally high corrosion resistance and attractive appearance. Nickel free, high chromium stainless steels are especially preferred for architectural uses because of their lustrous appearance; however, one problem encountered with stainless steels, especially nickel free, high chromium stainless steels, used for exterior applications, such as architectural applications, is atmospheric corrosion. Atmospheric corrosion is especially severe in marine atmospheres, where chloride ion is present in atmospheric water apor, and in industrially polluted atmospheres, where various sulfur compounds and "acid rain" are present in the atmosphere. Coatings that are capable of reducing the effects of atmospheric corrosion have, heretofore, done so at high cost, loss of effectiveness of metal for the intended use, or at the expense of the appearance of the metal.

SUMMARY OF THE INVENTION

As herein contemplated, an adherent, corrosion resistant coating of disordered silicon oxide is applied by plasma chemical vapor deposition processes over at least a portion of a stainless steel substrate. The resultant, coated, article, e.g., a steel or stainless steel article, is characterized by an adherent, pin hole free, bendable, ductile, weldable, workable coating. The coating is corrosion resistant, especially to chloride ions and sulfur containing products of combustion. Moreover, the coating, at the thicknesses herein contemplated, is transparent, preserving the lustre of the underlying substrate.

Further, the materials in the coating, as well as the deposition methods and deposition apparatus contemplated by the invention are low in cost, and are thus economical for large throughput applications.

In one embodiment of the invention, the coatings are prepared by plasma assisted chemical vapor deposition of process gas mixtures containing silicon and oxygen, such as, in one embodiment, a premixed deposition gas mixture of nitrous oxide, a silane, and a gaseous energy transport agent. The deposition process is radio frequency assisted or microwave assisted. It is believed that the high quench rates of the contemplated plasma assisted chemical vapor processes provide the desired disordered materials.

"Glow discharge deposition", i.e., plasma assisted chemical vapor deposition, is shown and described generally in U.S. Pat. No. 4,226,898 to Stanford R. Ovshinsky, et al for *Amorphous Semiconductors Equivalent To Crystalline Semiconductors Produced By A Glow Discharge Process*, the disclosure of which is incorporated herein by reference.

"Radio frequency radiation", also referred to herein as "r.f. radiation", is generally understood to be that portion of the electromagnetic spectrum having frequencies between the audio portion of the electromagnetic spectrum and the far infrared portion of the electromagnetic spectrum, i.e., from 0.1 megahertz to about 100 gigahertz, and wave lengths corresponding thereto of from about $3 \times 10^3$ meters for 0.1 megahertz radiation to $3 \times 10^{-3}$ meter for 100 gigahertz radiation.

"Microwave radiation" is generally understood to be that portion of radio frequency radiation having frequencies in the gigahertz range, i.e., above about 1 gigahertz. This is the generally accepted definition found in the *IEEE Standard Dictionary of Electrical and Electronics Terms*, F. Jay, editor, IEEE, New York, NY (1977) at page 416.

Glow discharge deposition may be carried out with a direct current field, with an alternating, or with a biased alternating current field. When glow discharge deposition is carried out with an alternating current field or a biased alternating current field it is referred to as "radio frequency glow discharge deposition". "Microwave glow discharge deposition" is "radio frequency glow discharge deposition" where the radio frequency component is in the microwave range. Preferably the coatings herein contemplated are deposited by radio frequency glow discharge deposition. In a particularly preferred exemplification the coatings are deposited by microwave assisted glow discharge.

The resulting coatings, when applied by glow discharge deposition, especially at microwave frequencies, form particularly stable, corrosion resistant, amorphous coatings on steel. Moreover, when the coatings are applied by microwave assisted glow discharge the deposition rates are high, e.g., on the order of 500 angstroms, allowing a 0.1 micron coating to be applied in 2 seconds, and a 1.0 micron coating to be applied in 20 seconds.

BRIEF DESCRIPTION OF THE FIGURES

The invention contemplated herein may be understood by reference to the Figure appended hereto.

DETAILED DESCRIPTION OF THE INVENTION

Figure 1:
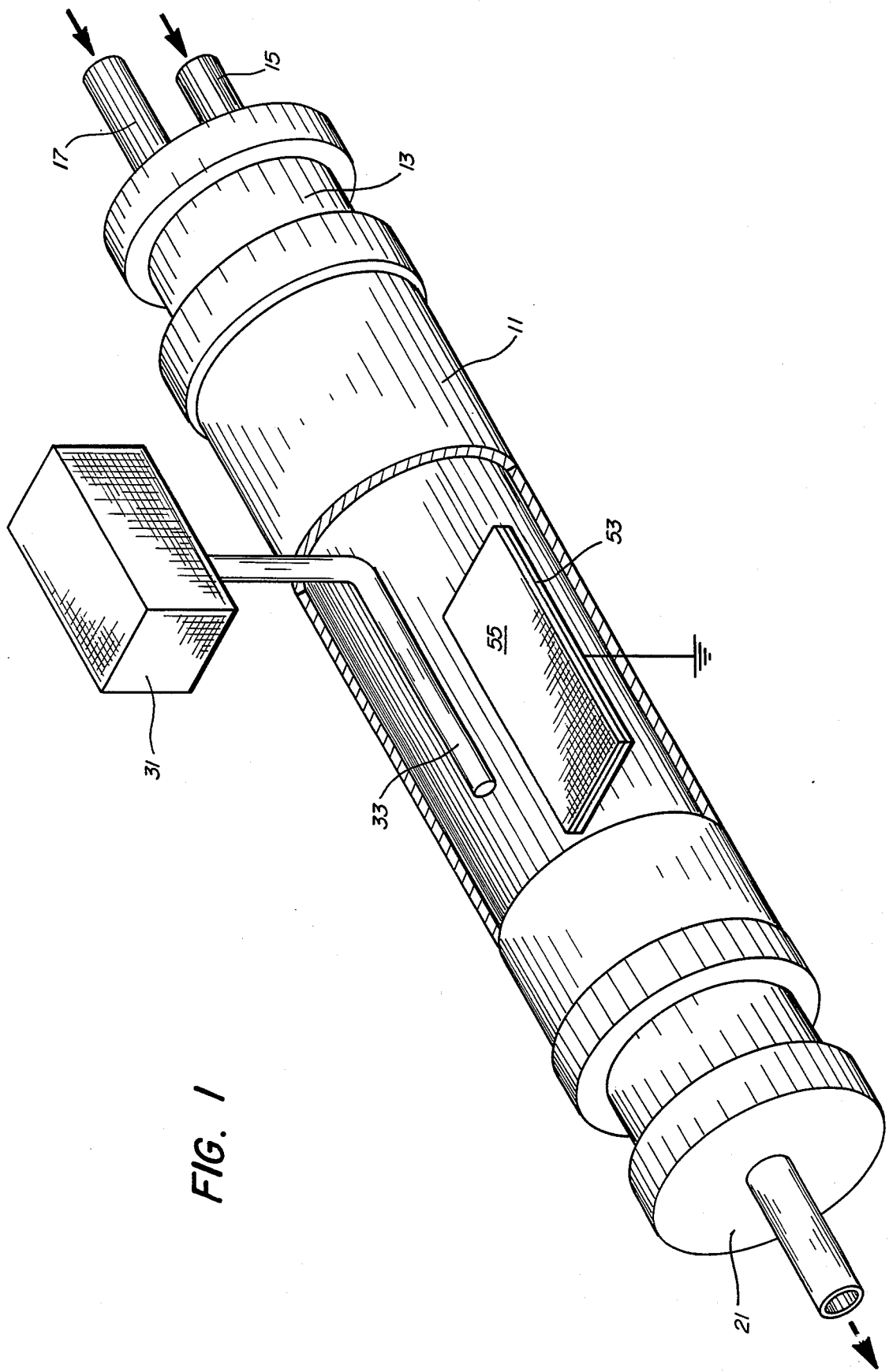
FIG. 1 is a partial cutaway, isometric schematic view of batch glow discharge apparatus useful in an embodiment of the invention where the corrosion resistant coating is applied by batchwise microwave glow discharge.

The invention includes is a coated article, e.g., a coated stainless steel article, a plasma assisted chemical vapor deposition method of preparing the coated article, e.g., a batch, semibatch, or continuous process, and apparatus for coating the article. The coated article, e.g., the coated stainless steel article, is useful, for example, in exterior applications such as architectural shapes, vehicle and aircraft bodies, and cargo containers where a lustrous appearance is desirable. The coated article is also useful in corrosive applications where purity of the product is essential, as in chemical processing equipment and food processing equipment, for example, heat exchangers, reactors, heating kettles, reaction kettles, and the like. In the case of decorative articles, the coatings are especially useful where the luster of the underlying substrate must be preserved.

The underlying article may be a stainless steel substrate, e.g., a high chromium, low nickel, or even nickel free stainless steel. Stainless steel is a lustrous material characterized by relatively high resistance to corrosive environments. However, industrial and marine environments can corrode stainless steel especially high chromium, low nickel or even nickel free stainless steels to the extent where the stainless steel loses its lustre.

The herein contemplated coating is a corrosion resistant coating comprising disordered silicon dioxide of the stoichiometry $SiO_{2-x}$, where x is from 0 to 0.4. At thicknesses up to about 5 microns, the herein contemplated coatings are substantially transparent. The disorder of the silicon oxide may be such as to be amorphous, microcrystalline, polycrystalline lacking long range compositional order, or a mixture of at least two types of disorder as amorphous, microcrystalline, or polycrystalline. Additionally, the disordered silicon oxide coating material may be characterized by the presence of crystalline inclusions while still being within the intended scope of the invention.

When the substrate is a stainless steel substrate, it may be a pickled substrate. A pickled stainless steel substrate has a passivating oxide layer formed by an acid etch, e.g., a nitric acid etch, a sulfuric acid etch, or a hydrofluoride acid etch. Typically pickled stainless steel has surface features, e.g., peaks, valleys, inclusions, holidays, and the like, having a characteristic dimension of up to about 2000 angstoms. Alternatively the stainless steel substrate may be bright annealed. Bright annealed stainless steel substrate has oxygen thermally diffused into the surface to build up a non-discoloring surface oxide film. Bright annealed stainless steel typically has an oxide film about 50 to 200 angstroms thick and surface features, e.g., peaks, valleys, inclusions, holidays, and the like, having a characteristic dimension of about 600 to 800 angstroms. The herein contemplated coating has a thickness sufficient to either mask the features,k or to smooth and conform to the features.

The herein contemplated coating has a thickness of at least about 100 angstroms (0.01 micron) and preferably above about 1000 angstroms (0.1 micron) to about 1.0 micron or more. Thicknesses less than about 1000 angstroms should be avoided whereby to avoid pin holes, e.g., on bright annealed stainless steel substrates, and incomplete coverage, e.g., on pickled stainless steel substrates. The maximum coating thickness of about 5.0 microns is such as to provide a substantially transparent coating, preserving the lustrous appearance of the underlying substrate, and not interfering with ductility, or bendability of the article, or causing the surface to delaminate on bending, working, or welding. The coating thickness may exceed 5.0 microns, and be up to 50.0 microns thick, if it is not necessary to preserve the lustrous appearance of the underlying substrate or to preserve the ductility workability or weldability of the disordered coating material.

The coating herein contemplated is resistant to atmospheric corrosion. Corrosion resistance may be tested utilizing the procedure described by S. Ito, M. Yabumoto, H. Omata, and T. Murata of Nippon Steel Corp., in "Atmospheric Corrosion of Stainless Steels", appearing in *Passivity of Metals and Semiconductors* (M. Fromment, ed.), Elsevier Science Publishers, B.V., Amsterdam, at pages 637 to 642, the disclosure of which is incorporated herein by reference. Utilizing the procedure of Ito, et al the coating herein contemplated does not exhibit a decrease in potential versus a reference electrode for at least about 100 hours when a sodium chloride wetted woven cotton cloth is placed on the coated surface, the cloth being first immersed in 0.5 normal aqueous sodium chloride, and the wetted woven cotton cloth and coated substrate then being placed in a constant temperature, constant humidity chamber at a temperature of 25° C. and a relative humidity of 55%. This simulates atmospheric corrosion, especially in marine areas, where salt water and/or brine containing chloride ion contacts the material and evaporates, leaving behind concentrated solutions of chloride ion. The potential between the surface and a reference electrode is measured. The onset of corrosion is evidenced when the potential exhibits a sudden drop. A corrosion resistant coating does not exhibit the sudden drop in corrosion resistance until after at least 100 hours of testing. By way of contrast, uncoated type 430 stainless steel shows a 400 millivolt drop in potential by approximately 100 hours of exposure when tested as described above.

Corrosion resistance is also evidenced by a high pitting potential. The higher the pitting potential, the greater resistance to corrosion. The herein contemplated silicon oxide coatings have a pitting potential in 3.5 weight percent NaCl (aqueous) of above about 600 millivolts versus a saturated calomel electrode.

Corrosion resistance is further evidenced by the pin-hole rating. The pin-hole rating is a measure of the size, and distribution of pin holes, and fraction of pin-hole area in accordance with *Japan Industry Standards* (J.I.S.) H-8502 (1982), incorporated herein by reference. According to J.I.S. H-8502 (1982) the pin hole test is a five minute test in an aqueous solution of 0.1 gram/liter of potassium ferricyanide, 0.1 gram/liter of potassium ferrocyanide, and 0.6 gram/liter of sodium chloride. The herein contemplated coatings have a five minute pin-hole test rating of at least 9.8-2.

Corrosion resistance is still further evidenced by the salt spray rating. The salt spray rating is a measure of the discoloration of the stainless steel compared to standards in accordance with *Japan Industry Standards* (J.I.S.) H-8502 (1982), incorporated herein by reference. According to J.I.S. H-5802 (1982) the salt spray test is a twenty four hour test at 36° C. in a salt spray chamber, with an aqueous solution of 5 weight percent NaCl and 0.2 weight percent hydrogen peroxide. "A" is the highest rating and "F" is the lowest rating. The herein contemplated coatings have a twenty four hour salt spray test rating of at least B.

The herein contemplated article having an adherent, ductile, disordered silicon oxide coating on a stainless steel substrate is prepared by bringing the substrate into a vacuum deposition chamber and maintaining the substrate in vacuum. While the substrate is maintained in a vacuum, deposition gas mixture, e.g. a premixed gas mixture, comprising a silane, nitrous oxide, and an energy transfer agent is introduced into the vacuum chamber under conditions to form and/or maintain a plasma within the vacuum chamber. The plasma is maintained under conditions to deposit the silicon oxide coating onto the substrate.

The substrate may be degreased prior to vacuum deposition. Degreasing may be by vapor degreasing in a halogenated hydrocarbon vapor, or by ultrasonic degreasing in, e.g., an ultrasonically excited solvent. Exemplary solvents incude halogenated hydrocarbons, alcohols, ketones, aldehydes, and mixtures thereof, as acetone-isophropyl alcohol solutions.

The method of the invention may be understood by reference to accompanying FIG. 1. As there shown is a microwave glow discharge unit 1 having a vacuum chamber 11. Reactive gases such as silanes, nitrous oxide, oxygen and optionally one or more of ammonia, nitrogen, and phosphine are introduced into the vacuum chamber 11 through gas feed and flange 13 by gas inlet lines 15 and 17. These gases are converted into a plasma and the depleted gases exit the vacuum chamber 11 through a gas outlet end flange 21 and a gas outlet line therein.

In operative communication with the vacuum chamber 11 is provided a microwave source 31 and, within the vacuum chamber 11 is a microwave antenna 33. The antenna 33 is position d above the grounded substrate holder 53 and substrate 55 whereby to provide a microwave frequency signal to form, excite and/or maintain the plasma.

The plasma deposition process is a glow discharge process also referred to as a plasma chemical vapor deposition (PCVD) process. The energy to the plasma process may be direct current. or a radio frequency field including microwave range frequencies.

The plasma chemical vapor deposition process is a vacuum process with a vacuum of $10^{-5}$ torr or less initially provided in the vacuum chamber. The deposition gas has a pressure of about $10^{-3}$ to $10^{-1}$ torr. The deposition gas contains nitrous oxide, a silane or silanes, and an energy transfer agent. The content of nitrous oxide is from 20 to 80 atomic percent of the deposition gas, the content of silanes is from 10 to 40 atomic percent of the deposition gas. The energy transfer agent makes up the balance of the deposition gas. The contents of the gases in the deposition gas are such as to provide a nitrous oxide to silane ratio of from about 3:1 to about 5:1. While nitrous oxide to silane ratios above about 5:1 may be used without diminution in coating properties, such high ratios result in lower deposition rate. Nitrous oxide to silane ratios below about 3:1 result in too little oxygen and too much hydrogen and nitrogen in the coating.

The concentration of energy transfer agent is limited at the lower end by the quality, adhesion, and hydrogen and nitrogen contents of the coating, preferably the ratio of energy transfer agent to total nitrous oxide and silane is from 0.4:1 to 2.5:1. An energy transfer agent content of at least 35 atomic percent being required for exclusion of hydrogen and nitrogen in the film coating. The upper limit of energy transfer agent is set by an economic balance of coating quality versus deposition rate. At energy transfer agent concentrations above about 75 atomic percent the deposition rate becomes too low and the gas recirculation becomes inordinately high.

The silane may be silane, $SiH_4$, or a higher homologue, $Si_nH_{2n+2}$, where n is from 2 to about 4, or mixtures thereof silane, $SiH^4$, is referred for reasons of cost and availability, although other silanes, including branched silanes, may offer advantages in coating properties.

The energy transfer agent is an inert gas, e.g., a gas chosen from the group consisting of He, Ar, Xe, and Kr. Helium is preferred because of its light weight and the concommitant lack of transfer agent inclusion in the coating.

The temperature of the substrate 55 is maintained low enough to provide a quench rate of above about $10^5$° C. per second, but high to promote coating adhension and stress relief. Typically, the temperature of the substrate is above about 200° C. and in a particularly preferred exemplification and temperature of the substrate is from about 200° of 350° C.

The herein contemplated method of plasma chemical vapor deposition at the contemplated microwave frequency provides a deposition rate of above 500 angstroms per second. In this way, it is possible to rapidly build up a coating of about 1000 angstroms thickness within about 2 seconds of residence time. Thus, it is possible to coat large area stainless steel sheets in a very short period of time, and to continuously coat large area stainless steel sheets in a D.C. or A.C. generated plasma chemical vapor deposition system. For example, according to the invention it is possible to continuously coat steel, for example, from a feed roll of stainless steel sheet through a plasma chemical vapor deposition system to a take-up roll of coated steel sheet with a residence time in the plasma deposition vacuum chamber of less than about 100 seconds.

According to a particularly preferred exemplification of this invention, rolled stainless steel sheet is introduced into the vacuum chamber and drawn out the other end. The chamber may be initially at a vacuum of about $10^{-5}$ torr, pressurized with a reactive gas to a pressure of about $10^{-2}$ torr to about $10^{-1}$ torr, the reactive gas containing nitrous oxide, silanes and helium. A microwave source is energized whereby to provide microwave energy at a frequency of about 2.45 gigahertz between a microwave antenna witnin the vacuum chamber and the stainless steel roll to be coated. The steel is drawn through the vacuum chamber from the inlet end to the outlet end at a linear velocity of about 10 feet per second to about 100 feet per second whereby to form a corrosion resistant coating of disordered silicon oxide about 50 to 100 angstroms thick at a residence time of about 2 to about 100 seconds.

According to a particularly preferred exemplification of the invention, the corrosion resistant coating is applied in a continuous or semicontinuous process. This expedient obviates the necessity of sequentially initiating and terminating the conditions of vacuum, temperature, and gas flow necessary for deposition.

The herein contemplated continuous or semi-continuous process allows either an elongated web of substrate material, e.g., stainless steel sheet or roll, or a substrate plate carried by a conveyor belt, e.g., a stainless steel plate, to be processed through gas deposition apparatus. One particularly desirable gas deposition system is shown in U.S. Pat. No. 4,485,125 to M. Izu and H. Ovshinsky for *METHOD FOR CONTINUOUSLY PRODUCING TANDEM AMORPHOUS PHOTOVOLTAIC CELLS*, the disclosure of which is incorporated herein by reference.

Izu and Ovshinsky describe apparatus for continuously moving a substrate through a gas deposition chamber or chambers, effecting a vacuum in the chamber, heating the chamber to warm the substrate and the reaction gas, introducing the reaction gas into the deposition chamber, forming a plasma in the chamber, and controlling process variables, e.g., substrate velocity, substrate tension, gas concentration, and vacuum, whereby to continuously produce an adherent deposit on the substrate.

The apparatus includes means for continuously "steering" or "tracking" the substrate or conveyor belt, i.e., to continuously or substantially contlnuously position and align the substrate or conveyor belt with respect to substrate or conveyor belt take up means. This prevents buckling of the substrate. The apparatus further includes means for controlling the tension of the substrate.

The apparatus includes one or more deposition chambers. The chambers may be isolated or in communication with each other. When the chambers are isolated from each other they are isolated by gas gate means as described by Izu and Ovshinsky, above.

Figure 2:
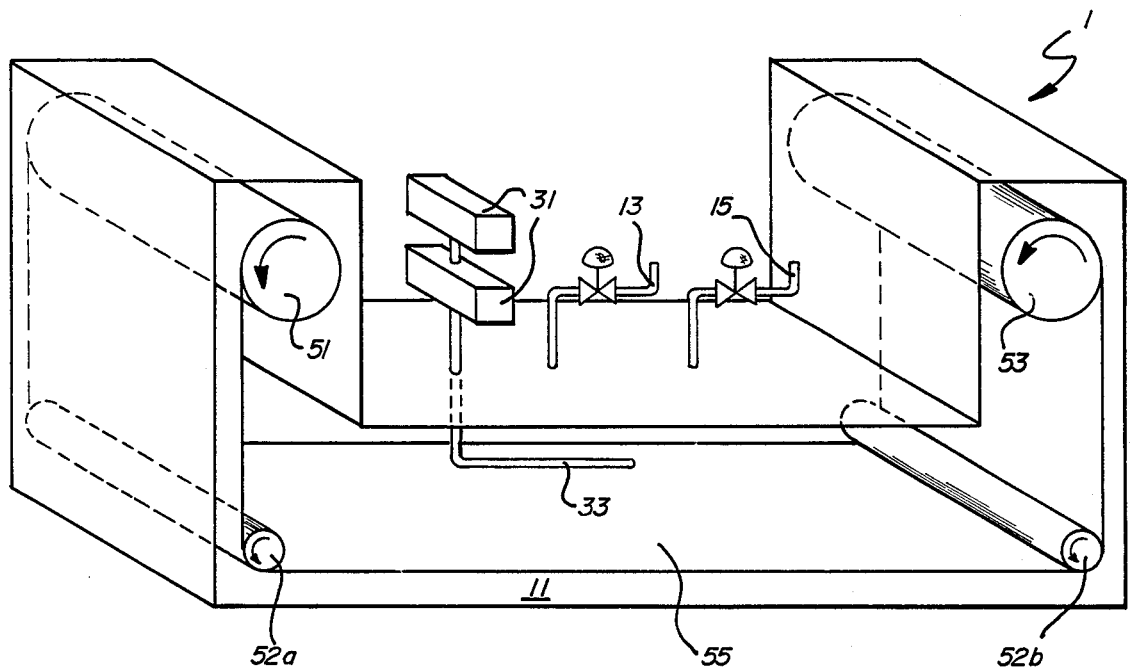
FIG. 2 is a partial cutaway, isometric schematic view of glow discharge apparatus useful in an embodiment of the invention where the corrosion resistant coating may be applied continuously or semicontinuously by microwave glow discharge.
Figure 3:
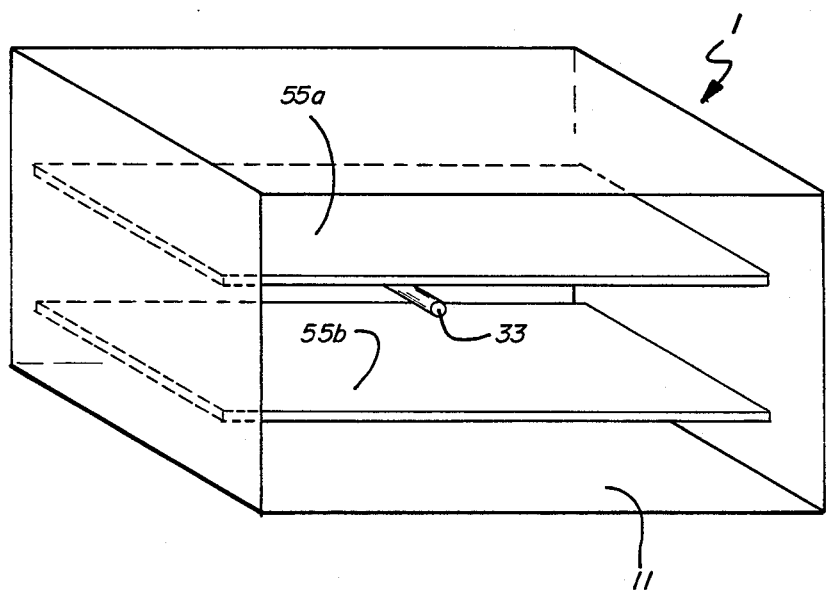
FIG. 3 is a partial cutaway, isometric schematic view of glow discharge apparatus allowing for simultaneous deposition on two substrates in a single glow discharge region.

The substrate may be fed through the deposition apparatus in a single pass as shown in FIG. 2. Alternatively, two substrates may be passed through the apparatus countercurrently or in parallel, whereby to attain high gas utilization. According to a still further exemplification, the substrate may be fed through the deposition chamber two or more times, as shown in FIG. 3 whereby to attain higher gas utilization. FIG. 3 shows a "tower" method of operation where the deposition takes place within the leaves of the substrate.

FIG. 2 is an isometric partial cutaway, schematic view of a continuous deposition 1. The system 1 includes a vacuu chamber 11 with gas feed means 13 and vacuum pump means 15, and energy input means, e.g., power supply and tuner 31. Coiled or rolled substrate 55 is fed from feed roll 51, over idlers 52a, 52b, to take up roll 53. The roll-to-roll movement of the substrate 55 takes place under vacuum.

FIG. 3 is an isometric, partial cutaway, schematic view of an alternative exemplification where two substrates 55a, 55b move geometrically in parallel on opposite sides of the power supply 33.

While the invention has been described with respect to particular preferred exemplifications thereof, it is not intended to be limited thereby, but solely by the claims appended hereto.

What we claim is:

1. A stainless steel article having an adherent, corrosion resistant coating thereon, substantially free of nitrogen and hydrogen, and comprising microwave plasma assisted chemical vapor deposition deposited $SiO_{2-x}$ where x is from 0.0 to 0.4, said coating being deposited from a deposition gas at a pressure of $10^{-3}$ to $10^{-1}$ torr and consisting essentially of 10 to 40 volume percent silanes, 20 to 80 volume percent nitrous oxide, balance inert gas energy transfer agent, said inert gas energy transfer agent being at least 35 volume percent of the deposition gas where the ratio of nitrous oxide to silanes is 3:1 to 5:1, and the ratio of (nitrous oxide plus silanes) to inert gas energy transfer agent is from 0.4:1 to 2.5:1.

2. The stainless steel article of claim 1 wherein the article has a stainless steel substrate having surface features of up to 2000 Angstroms, and the coating is thick enough to cover the features.

3. The stainless steel article of claim 2 wherein the stainless steel is bright annealed, the surface features have a characteristic dimension of about 500 to 1000 angstroms, and the coating is at least 0.1 micron thick.

4. The stainless steel article of claim 2 wherein the stainless steel is pickled, the surface features have a characteristic dimension of at least about 2000 angstroms, and the coating is at least about 0.1 micron thick.

5. The article of claim 1 wherein the inert gas energy transfer agent is an inert gas chosen from the group consisting of He and Ar.

6. The article of claim 5 wherein the inert gas energy transfer agent is He.

7. The article of claim 1 wherein the silane is chosen from the group consisting of silane, disilane, and higher silanes.

8. The article of claim 7 wherein the silane consists essentially of $SiH_4$.

9. The article of claim 1 wherein said coating is deposited at a deposition rate of at least 500 angstroms per second.

10. The article of claim 1 wherein the substrate in stainless steel, and the coating has a pitting potential of at least 600 mv vs SCE in 3.5 weight percent NaCl solution.

11. The article of claim 1 wherein the substrate is stainless steel and the article has a J.I.S. H-8502 (1982) five minute pinhole rating in potassium ferricyinide-potassium ferrocyanide-sodium chloride of at least 9.8-2.

12. The article of claim 1 wherein the substrate is stainless steel and the article has a J.I.S. H-8502 (1982) twenty four hour salt spray rating in 5% NaCl-0.2% hydrogen peroxide of at least B.

13. A method of depositing a corrosion resistant, adherent coating on a stainless steel substrate comprising the steps of:
    (a) degreasing the stainless steel substrate;
    (b) heating the stainless steel substrate to a temperature range to facilitate adhesion of the coating thereon;
    (c) forming a deposition gas of nitrous oxide, a silane, and an energy transfer agent at a pressure of $10^{-3}$ to $10^{-1}$ torr, said deposition gas consisting essentially of (i) 10 to 40 volume percent silanes, (ii) 20 to 80 volume percent notrous oxide, and (iii) balance inert gas energy transfer agent, said inert gas energy transfer agent being at least 35 volume percent of the deposition gas; where the ratio of nitrous oxide to silanes is 3:1 to 5:1, and the ratio of (nitrous oxide plus silanes) to insert gas energy transfer agent is 0.4:1 to 2.5:1;
    (d) forming a plasma of the deposition gas; and
    (e) contacting the stainless steel substrate with deposition gas under plasma assisted chemical vapor deposition conditions whereby to form the coating thereon.

14. The method of claim 13 wherein the energy transfer agent is an inert gas chosen from the group consisting of He and Ar.

15. The method of claim 14 wherein the energy transfer agent is He.

16. The method of claim 13 wherein the silane is chosen from the group consisting of silane, disilane, and higher silanes.

17. The method of claim 16 wherein the silane consists essentially of $SiH_4$.

18. The method of claim 13 wherein said coating is deposited at a deposition rate of at least 500 angstroms per second.

19. The method of claim 13 wherein the stainless steel substrate has surface features and the coating is thick enough to cover the surface features.

20. The method of claim 19 wherein the stainless steel is bright annealed, the surface features have a characteristic dimension of about 500 to 1000 angstroms, and the coating is at least 0.1 micron thick.

21. The method of claim 19 wherein the stainless steel is pickled, the surface features have a characteristic dimension of at least about 2000 angstroms, and the coating is at least about 0.1 micron thick.

22. The method of claim 19 wherein the resulting coating has a pitting potential of at least 600 mV vs. S.C.E. in 3.5 weight percent NaCl solution.

23. The method of claim 19 wherein the resulting coating has a J.I.S. H-8502 (1982) five minute pinhold rating in potassium ferricyanide - potassium ferrocyanide-sodium chloride of at least 9.8-2.

24. The method of claim 19 wherein the resulting coating has a J.I.S. H-8502 (1982) twenty four salt spray rating in 5% NaCl - 0.2% hydrogen peroxide of at least B.

25. The method of claim 23 comprising continuously depositing said coating.

* * * * *